United States Patent
Tiner et al.

(10) Patent No.: US 10,087,524 B2
(45) Date of Patent: *Oct. 2, 2018

(54) SHOWERHEAD SUPPORT STRUCTURE FOR IMPROVED GAS FLOW

(71) Applicant: Applied Materials, Inc., Santa Clara, CA (US)

(72) Inventors: Robin L. Tiner, Santa Cruz, CA (US); Soo Young Choi, Fremont, CA (US); Qunhua Wang, Santa Clara, CA (US); Jrjyan Jerry Chen, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1168 days.

This patent is subject to a terminal disclaimer.

(21) Appl. No.: 14/275,835

(22) Filed: May 12, 2014

(65) Prior Publication Data

US 2014/0246521 A1 Sep. 4, 2014

Related U.S. Application Data

(63) Continuation of application No. 13/163,241, filed on Jun. 17, 2011, now Pat. No. 8,721,791.

(Continued)

(51) Int. Cl.
*B05B 1/00* (2006.01)
*C23C 16/455* (2006.01)
*H01J 37/32* (2006.01)

(52) U.S. Cl.
CPC ........ *C23C 16/45565* (2013.01); *B05B 1/005* (2013.01); *H01J 37/3244* (2013.01)

(58) Field of Classification Search
CPC .............. B05B 1/005; C23C 16/45561; C23C 16/45563; C23C 16/45565;
(Continued)

(56) References Cited

U.S. PATENT DOCUMENTS 5,792,269 A * 8/1998 Deacon ............. C23C 16/45565
118/715
6,477,980 B1 11/2002 White et al.
(Continued)

FOREIGN PATENT DOCUMENTS

CN 1758826 A 4/2006
EP 1685272 A1 8/2006
(Continued)

OTHER PUBLICATIONS

International Search Report and Written Opinion dated Jan. 12, 2012 in PCT/US2011/043358.
(Continued)

*Primary Examiner* — Benjamin Kendall
(74) *Attorney, Agent, or Firm* — Patterson + Sheridan LLP

(57) ABSTRACT

Embodiments of the present invention generally provide apparatus and methods for supporting a gas distribution showerhead in a processing chamber. In one embodiment, a gas distribution showerhead for a vacuum chamber is provided. The gas distribution showerhead comprises a body having a first side and a second side opposite the first side, and a plurality of gas passages formed through the body, the gas passages comprising a first bore formed in the first side that is fluidly coupled to a second bore formed in the second side by a restricting orifice, and a suspension feature formed in the first bore of at least one of the gas passages.

20 Claims, 11 Drawing Sheets

Related U.S. Application Data

(60) Provisional application No. 61/368,601, filed on Jul. 28, 2010.

(58) Field of Classification Search
CPC .......... C23C 16/4557; C23C 16/45572; C23C 16/45576; C23C 16/45591; C30B 25/14–25/165; H01J 37/3244; H01J 37/32449
See application file for complete search history.

(56) References Cited

U.S. PATENT DOCUMENTS

| | | | |
|---|---|---|---|
| 7,429,410 B2 | 9/2008 | Keller et al. | |
| 7,641,762 B2 | 1/2010 | Keller | |
| 2004/0003777 A1 | 1/2004 | Carpenter et al. | |
| 2004/0206305 A1 | 10/2004 | Choi et al. | |
| 2005/0133161 A1 | 6/2005 | Carpenter et al. | |
| 2006/0288934 A1* | 12/2006 | Takahashi ............ | C23F 4/00 118/715 |
| 2008/0099145 A1 | 5/2008 | Keller | |

FOREIGN PATENT DOCUMENTS

| | | |
|---|---|---|
| JP | 2006121057 | 5/2006 |
| JP | 2007-123840 | 5/2007 |
| JP | 4294478 | 7/2009 |
| KR | 10-0687373 | 5/2007 |
| WO | 9966101 | 12/1999 |
| WO | 03015481 | 2/2003 |

OTHER PUBLICATIONS

Chinese Office Action for CN201180026734.1 dated Jul. 10, 2014.
Chinese Office Action for Application No. 201510891705.1 dated Aug. 1, 2017.
Korean Office Action for Application No. 10-2012-7031363 dated Sep. 5, 2017.
Japanese Office Action for Application No. JP 2013-521800 dated May 26, 2015.
Japanese Office Action for Application No. JP 2016-95807 dated Apr. 28, 2017.
Taiwan Office Action for Application No. TW 100124478 dated Aug. 5, 2015.

* cited by examiner

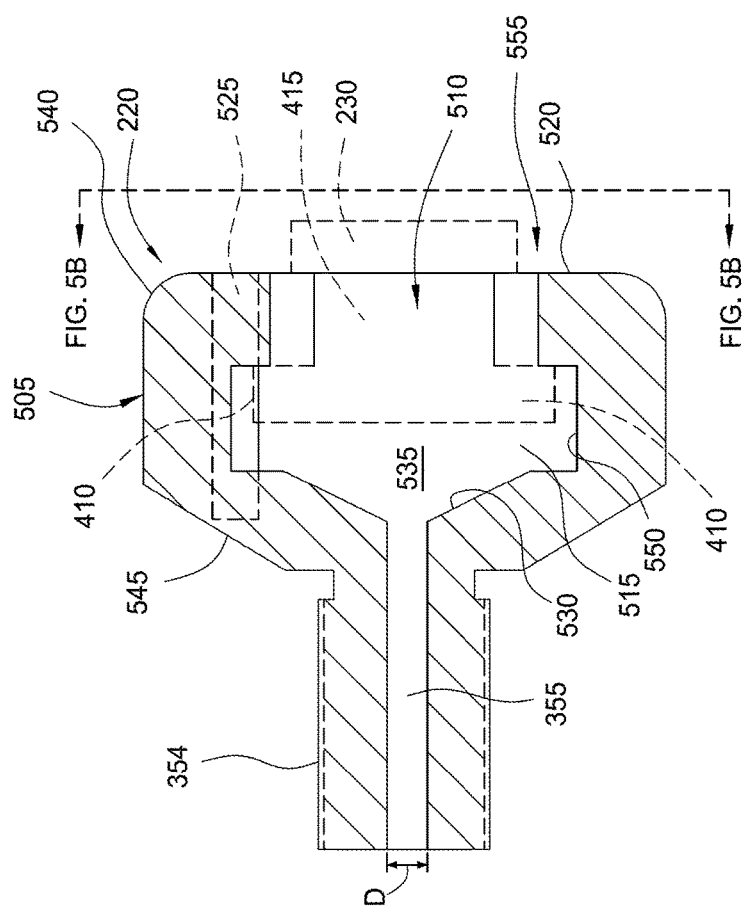
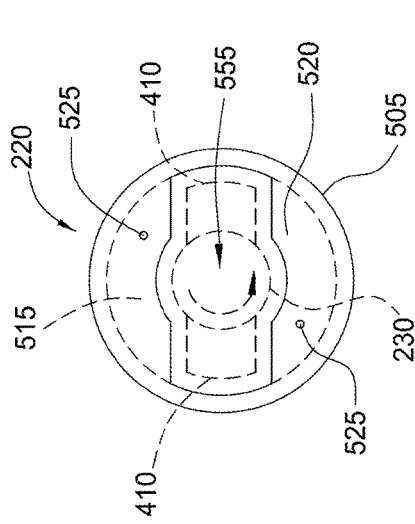
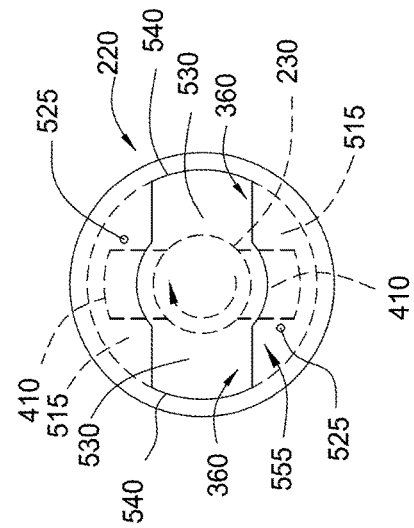
FIG. 5A
FIG. 5B
FIG. 5C

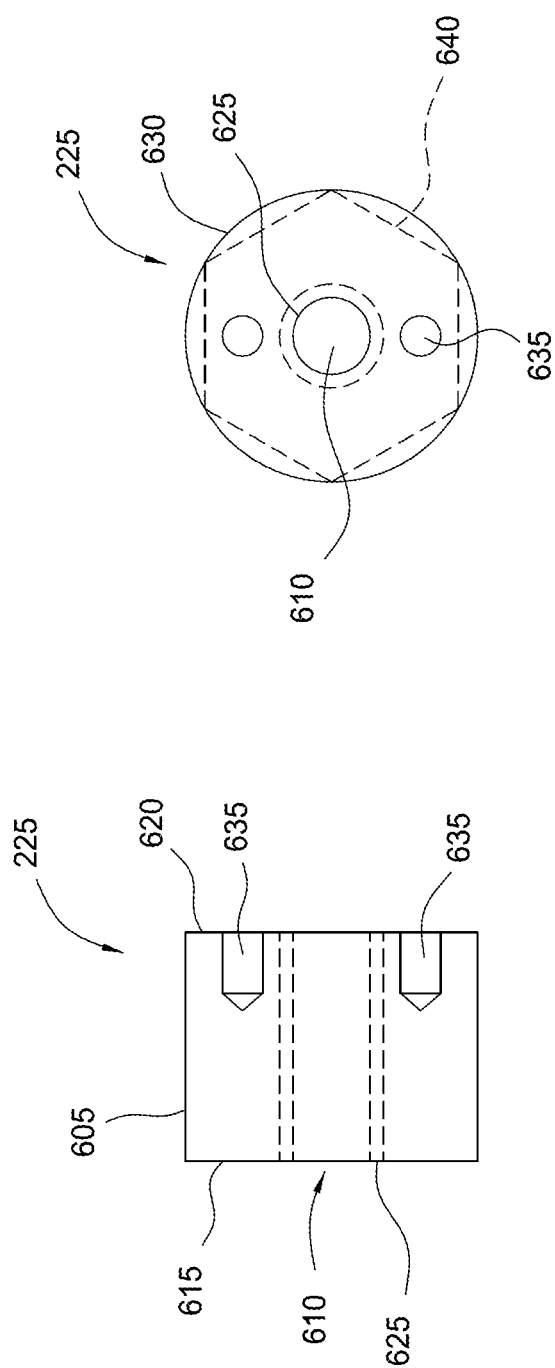

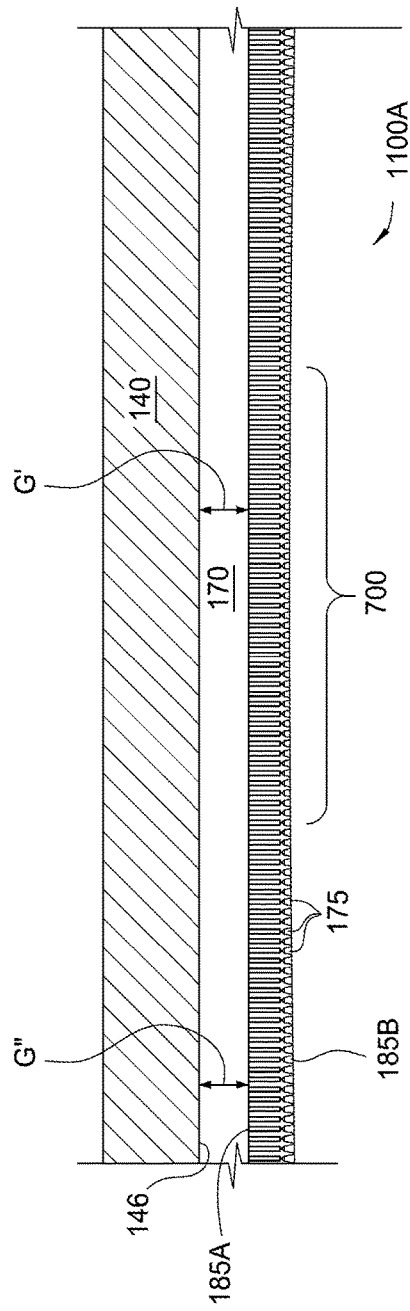
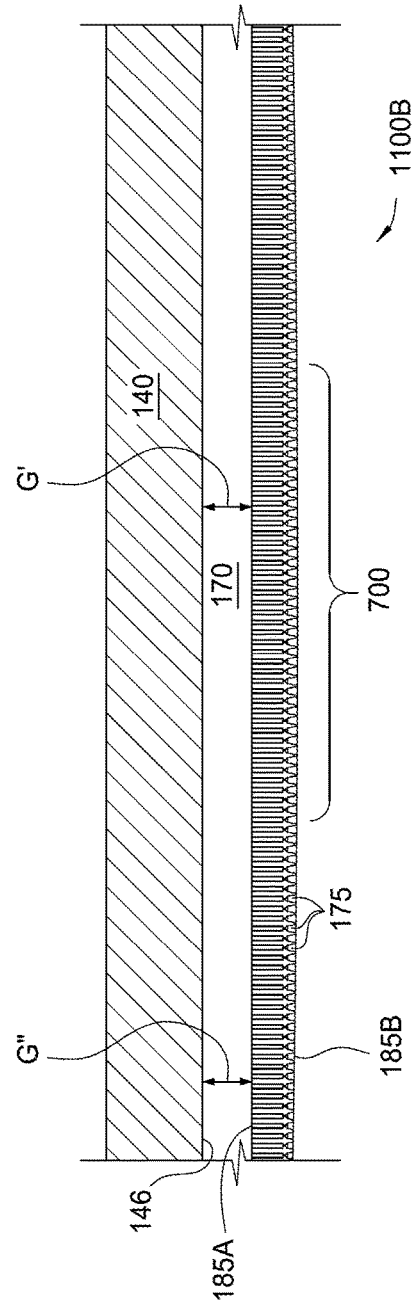

SHOWERHEAD SUPPORT STRUCTURE FOR IMPROVED GAS FLOW

CROSS-REFERENCE TO RELATED APPLICATIONS

This application is a continuation of U.S. patent application Ser. No. 13/163,241, filed on Jun. 17, 2011 and issued as U.S. Pat. No. 8,721,791 on May 13, 2014, which application claims benefit of U.S. Provisional Patent Application Ser. No. 61/368,601, filed Jul. 28, 2010, both applications are hereby incorporated by reference.

BACKGROUND OF THE INVENTION

Field of the Invention

Embodiments of the present invention generally relate to supporting a gas distribution showerhead within a plasma chamber. More specifically, the invention relates to supplying a gas to the chamber through the gas distribution showerhead.

Description of the Related Art

Plasma enhanced chemical vapor deposition (PECVD) is a deposition method whereby processing gas is introduced into a processing chamber through a gas distribution showerhead. The showerhead is electrically biased to ignite the processing gas into a plasma. The susceptor, sitting opposite to the showerhead, is electrically grounded and functions as an anode. The showerhead spreads out the processing gas as it flows into the processing space between the showerhead and the susceptor.

PECVD has recently become popular for depositing material onto large area substrates. Large area substrates may have a surface area of greater than about one square meter. Large area substrates may be used for flat panel displays (FPDs), solar panels, organic light emitting displays (OLEDs), and other applications. These processes require the large area substrate be subjected to temperatures on the order of 300° C. to 400° C. or higher, and maintained in a fixed position relative to the showerhead during deposition to ensure uniformity in the deposited layers.

The showerhead is generally a perforated plate supported in a spaced-apart relation above the large area substrate adapted to disperse a process gas and typically has substantially the same area as the to-be-processed substrate. Showerheads are commonly made of aluminum and are subject to expansion and contraction while enduring the temperatures during the PECVD processes. Showerheads are commonly supported around the edges and a center to maintain the processing space between the substrate and the showerhead. However, the typical center support schemes affect gas flow through the showerhead. When gas flow is not distributed sufficiently through the showerhead during deposition, the process may not produce uniform deposition on the substrate, which may result in an unusable large area substrate.

Therefore, what is needed is an apparatus and method for supporting a gas distribution showerhead that maintains the processing space between the substrate and the gas distribution showerhead and does not interfere with gas flow through the gas distribution showerhead.

SUMMARY OF THE INVENTION

The invention generally relates to a method and apparatus for supporting a gas distribution showerhead in a vacuum chamber. In one embodiment, a gas distribution showerhead for a vacuum chamber is provided. The gas distribution showerhead comprises a body having a first side and a second side opposite the first side, and a plurality of gas passages formed through the body, the gas passages comprising a first bore formed in the first side that is fluidly coupled to a second bore formed in the second side by a restricting orifice, and a suspension feature formed in the first bore of at least one of the gas passages.

In another embodiment, a gas distribution showerhead for a vacuum chamber is provided. The gas distribution showerhead includes a body having a first side opposing a backing plate and a second side opposite the first side, the body having a plurality of gas passages formed between the first side and the second side, each of the plurality of gas passages having a first bore formed in the first side that is fluidly coupled to a second bore formed in the second side by a restricting orifice, a suspension fitting disposed in the first bore of at least one of the plurality of gas passages forming an obstructed gas passage, and an alternative gas passage in fluid communication with a volume between the backing plate and the first side of the gas distribution showerhead providing gas flow to the obstructed gas passage.

In another embodiment, a vacuum chamber is provided. The vacuum chamber comprises a backing plate disposed proximate a gas distribution showerhead defining an intermediate volume therebetween. The gas distribution showerhead comprises a body having a first side in communication with the intermediate volume and a second side, a plurality of gas passages formed between a first side and the second side, each of the plurality of gas passages having a first bore formed in the first side that is fluidly coupled to a second bore formed in the second side by a restricting orifice, a support member disposed in at least one of the plurality of gas passages, the support member at least partially restricting gas flow to a blocked second bore, and an alternative gas passage in fluid communication with the intermediate volume providing gas flow to the at least one of the plurality of gas passages having the suspension fitting disposed therein.

In another embodiment, a method for processing a substrate is provided. The method includes suspending a gas distribution showerhead having a plurality of gas passages in a chamber by at least one support member disposed between the gas distribution showerhead and a backing plate, the at least one support member obstructing gas flow to at least one of the plurality of gas passages. The method also includes flowing a process gas to a volume between a backing plate and a gas distribution showerhead, flowing a portion of the process gas from the volume through a portion of the plurality of gas passages, and flowing another portion of the process gas through an alternative gas passage to the at least one of the plurality of gas passages that is obstructed by the support member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A is a side cross-sectional view of another embodiment of a screw device.

FIG. 5B is a top view of the screw device shown in FIG. 5A.

FIG. 5C is a top view of the screw device shown in FIG. 5B.

FIG. 6A is side view of one embodiment of a support nut.

FIG. 6B is a top view of the support nut shown in FIG. 6A.

FIGS. 11A and 11B are schematic partial cross-sectional views of alternative embodiments of a gas distribution showerhead.

Figure 1:
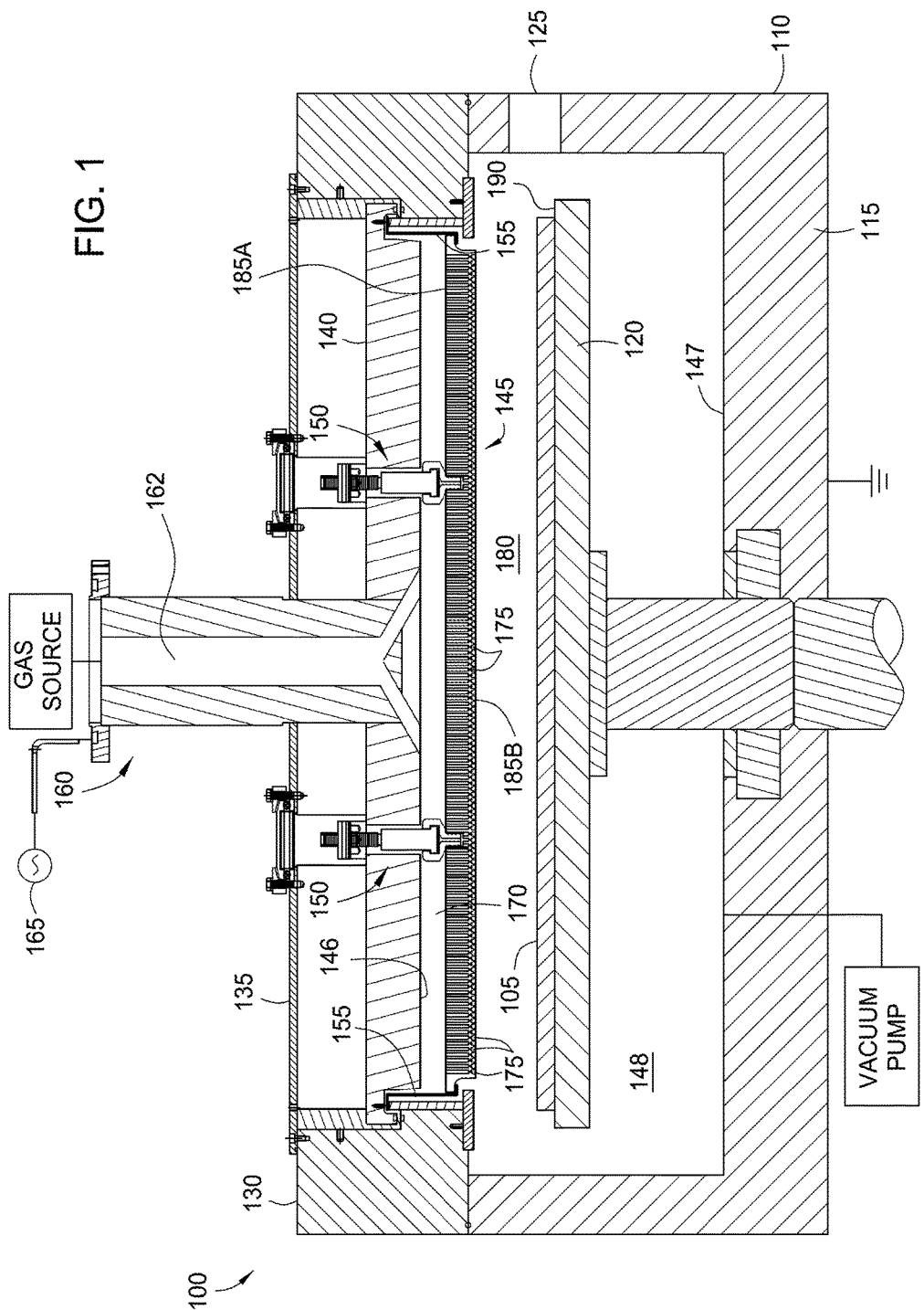
FIG. 1 is a schematic side cross-sectional view of one embodiment of a chamber.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present invention generally provide apparatus and methods for supporting a gas distribution showerhead in a processing chamber. In one embodiment, at least one support member coupled to a center region of the gas distribution showerhead is configured to support the gas distribution showerhead and facilitate resistance to center sag or bowing caused by one or a combination of gravitational forces, high processing temperatures, and negative pressure, thereby maintaining a desired horizontal profile in the gas distribution showerhead. The desired horizontal profile may be at least one of a level (e.g., planar) horizontal profile, a convex horizontal profile, or a concave horizontal profile. The desired horizontal profile may be formed or maintained, at least in part, by forces provided by the at least one support member. The horizontal profile of a gas distribution showerhead or diffuser as used herein refers to a cross-section of the gas distribution showerhead as shown in the applicable Figures. The invention will be described below in relation to a PECVD apparatus available from AKT America, Inc., a subsidiary of Applied Materials, Inc., Santa Clara, Calif. It is to be understood that the invention has applicability in other deposition chambers as well, including deposition chambers and PECVD apparatus available from other manufacturers.

FIG. 1 is a schematic side cross-sectional view of one embodiment of a chamber 100. The chamber 100 is suitable for plasma enhanced chemical vapor deposition (PECVD) processes for fabricating circuitry on a large area substrate 105 made of glass, a polymer, or other suitable substrate. The chamber 100 is configured to form structures and devices on the large area substrate 105 for use in the fabrication of liquid crystal displays (LCD's) or flat panel displays, photovoltaic devices for solar cell arrays, or other structures. The structures may be a plurality of back channel etch inverted staggered (bottom gate) thin film transistors which may comprise a plurality of sequential deposition and masking steps. Other structures may include p-n junctions to form diodes for photovoltaic cells.

The chamber 100 includes a chamber sidewall 110, a bottom 115, a substrate support 120, such as a susceptor, which supports the large area substrate 105 during processing. The gas distribution showerhead 145 is positioned opposite the substrate support 120 and the large area substrate 105. The chamber 100 also has a port 125, such as a slit valve, that facilitates transfer of and deposition processes on the large area substrate 105 by selectively opening and closing. The chamber 100 also includes a lid structure 130, a backing plate 140, and a gas distribution showerhead 145. In one embodiment, the lid structure 130 supports the backing plate 140 and the gas distribution showerhead 145. In one embodiment, an interior surface 146 of the backing plate 140 and an interior surface 147 of the chamber sidewall 110 bounds a variable pressure region 148. In one aspect, the chamber 100 comprises a body which includes the chamber sidewall 110, the bottom 115 and the backing plate 140 bounding the variable pressure region 148. The backing plate 140 is sealed on its perimeter by suitable o-rings at interfaces where the backing plate 140 and the lid structure 130 may contact each other. The o-rings facilitate electrical insulation as well as seal the variable pressure region 148 when negative pressure is provided by a vacuum pump coupled to the chamber 100.

In one embodiment, the gas distribution showerhead 145 is supported by the backing plate 140 at a central region thereof by one or more center support members 150. The one or more center support members 150 facilitate support of the gas distribution showerhead 145 at the central region of the gas distribution showerhead 145 to control the horizontal profile of the gas distribution showerhead 145 to mitigate the tendency of the gas distribution showerhead 145 to droop or sag due to one or a combination of heat, gravity and vacuum. The gas distribution showerhead 145 may also be supported at a perimeter thereof by a flexible suspension 155. The flexible suspension 155 is adapted to support the gas distribution showerhead 145 from its edges and to allow lateral expansion and contraction of the gas distribution showerhead 145. A flexible suspension is disclosed in U.S. Pat. No. 6,477,980, which issued Nov. 12, 2002 with the title "Flexibly Suspended Gas Distribution Manifold for A Plasma Chamber" and is incorporated by reference herein.

The chamber 100 is coupled to a gas inlet 160 that is coupled to a gas source and a plasma source 165. The plasma source 165 may be a direct current power source, a radio frequency (RF) power source, or a remote plasma source. The RF power source may be inductively or capacitively coupled to the chamber 100. The gas inlet 160 delivers process or cleaning gases from the gas source through a bore 162 to an intermediate region 170 defined between the backing plate 140 and the gas distribution showerhead 145. In one example of operation, process gases are delivered from the gas source while the interior of the chamber 100 has been pumped down to a suitable pressure by the vacuum pump. One or more process gases flow through the gas inlet 160 to the intermediate region 170 defined between the backing plate 140 and the gas distribution showerhead 145. The one or more process gases then flow from the intermediate region 170 through a plurality of openings or gas passages 175 formed through the gas distribution showerhead 145 to a processing region 180 defined in an area below the gas distribution showerhead 145 and above the substrate support 120.

The large area substrate 105 is raised from a transfer position to the processing region 180 by moving the substrate support 120 toward the gas distribution showerhead 145. The height of the processing region 180 may be varied as a process parameter based on a spacing between a lower surface of the gas distribution showerhead 145 and a substrate receiving surface 190 of the substrate support 120. The substrate support 120 may be heated by an integral heater, such as heating coils or a resistive heater coupled to or disposed within the substrate support 120.

A plasma may be formed in the processing region 180 by the plasma source 165 coupled to the chamber 100. The plasma excited gas is deposited thereon to form structures on the large area substrate 105. In one embodiment, the substrate support 120 is at ground potential to facilitate plasma formation in the processing region 180. A plasma may also be formed in the chamber 100 by other means, such as a thermally induced plasma. Although the plasma source 165 is shown coupled to the gas inlet 160 in this embodiment, the plasma source 165 may be coupled to the gas distribution showerhead 145 or other portions of the chamber 100.

The gas distribution showerhead 145 is made of or coated with an electrically conductive material and is coupled to the plasma source 165 through the gas inlet 160 or other connection so that it may function as a first electrode within the chamber 100. The materials chosen for the gas distribution showerhead 145 may include steel, titanium, aluminum, or combinations thereof, and the surfaces may be polished or anodized. The gas distribution showerhead 145 may include a first or upper surface 185A and a second or lower surface 185B. In one embodiment, the upper surface 185A and the lower surface 185B are substantially parallel in cross-section. In another embodiment, at least one of the upper surface 185A and the lower surface 185B may be curved in cross-section to define a concave surface. In another embodiment, at least one of the upper surface 185A and the lower surface 185B are curved to define a convex surface. In another embodiment, at least one of the upper surface 185A and the lower surface 185B are non-parallel. In one embodiment, the gas distribution showerhead 145 may include a thickness or cross-sectional dimension that is thicker at a perimeter and thinner at a center thereof to form a dished or "scooped" lower surface 185B. In this embodiment, at least the upper surface 185A is substantially planar or level. Thus, the thicker cross-sectional dimension at the perimeter of the gas distribution showerhead 145 relative to the center of the gas distribution showerhead 145 forms a desired horizontal profile that is concave relative to the horizontal profile of the substrate support 120. In another embodiment, the substrate receiving surface 190 of the substrate support 120 is substantially planar and the lower surface 185B of the gas distribution showerhead 145 is concave relative to the substrate receiving surface 190.

Figure 2:
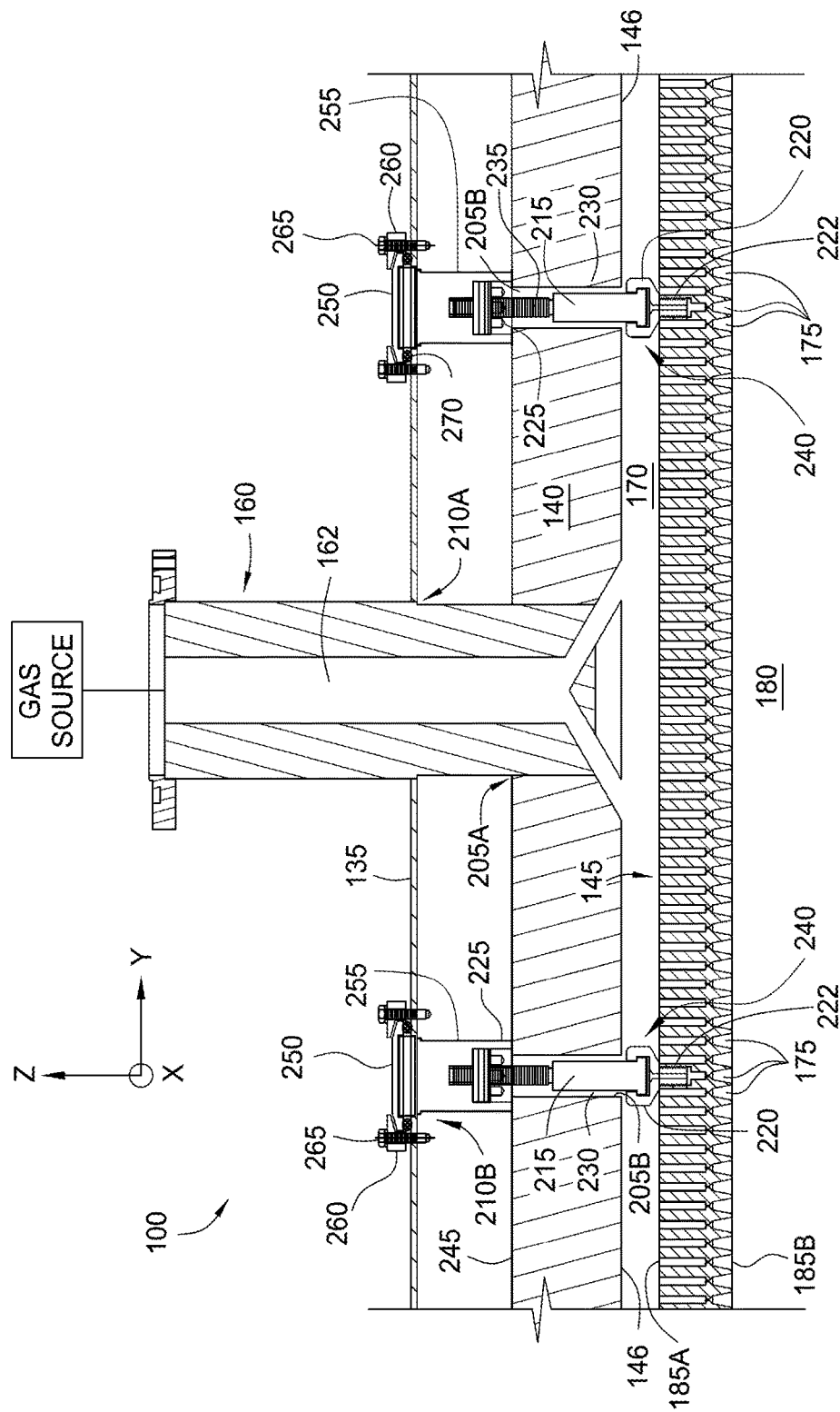
FIG. 2 is an enlarged partial cross-sectional view of the chamber of FIG. 1.

FIG. 2 is an enlarged partial cross-sectional view of the chamber 100 of FIG. 1. The backing plate 140 includes a plurality of openings extending therethrough, such as first opening 205A and one or more second openings 205B. In one embodiment, the first opening 205A is adapted to receive the gas inlet 160 and the one or more second openings 205B are configured to receive a respective center support member 150. In one embodiment, the first opening 205A is located at a substantial geometric center of the backing plate 140, although the first opening 205A may be positioned elsewhere. In embodiments where a cover plate 135 is utilized, the cover plate 135 contains through holes 210A and 210B to receive the gas inlet 160 and the center support members 150, respectively.

In one embodiment, each of the center support members 150 include a first support member 215 that detachably couples to a second support member, such as a suspension fitting 220. The first support member 215 may be detachably coupled to the suspension fitting 220 in any suitable manner, such as by mating bayonet fasteners, mating threaded portions, mating quarter-turn fasteners and the like. In the embodiment depicted in FIG. 2, the threaded support member 215 includes a shaft 230 at a first end thereof and a threaded portion 235 at a second end thereof. The threaded portion 235 is adapted to couple to a support nut 225. The support nut 225 is adapted to rotate relative to the threaded portion 235 and an upper surface 245 of the backing plate 140. The suspension fitting 220 may be fastened, welded, bonded or press-fit to the gas distribution showerhead 145 in a suspension feature 222 formed in or on the body of the gas distribution showerhead 145. The suspension feature 222 may be a mounting hole or a structure on a major surface of the gas distribution showerhead 145 that allows the suspension fitting 220 to mate with the gas distribution showerhead 145 in a manner that allows the gas distribution showerhead 145 to be pulled normally upward by a force applied to the suspension fitting 220. The force applied by the suspension fitting 220 to the gas distribution showerhead 145 may simply counter-act the force of gravity acting upon the gas distribution showerhead 145. The suspension fitting 220 may be keyed or include threads that engage with slots or threads disposed in the suspension feature 222 formed in the gas distribution showerhead 145. The suspension fitting 220 may also include a portion of a bayonet mount or other quarter-turn mounting interface that couples with the suspension feature 222 formed in the gas distribution showerhead 145. The suspension feature 222 is configured with the corresponding substrate that mates with the suspension fitting 220 as described above.

The backing plate 140 is relatively thicker in cross-section than the gas distribution showerhead 145. The gas distribution showerhead 145 is more flexible relative the backing plate 140 due to relative thickness and the perforations in the gas distribution showerhead 145. The backing plate 140 is configured to be stiffer than the gas distribution showerhead 145, thus being less affected by forces such as gravity, vacuum, and heat. The backing plate 140 may deflect due to these forces, but not to the degree that may be experienced by the gas distribution showerhead 145. Thus, the gas distribution showerhead 145 may experience some deformation caused by the aforementioned forces, but the deformation is effectively limited by stiffness of the backing plate 140. Thus, sag or deformation in the gas distribution showerhead 145 and/or backing plate 140 may be predetermined and counteracted by adjustment of the support nut 225.

The support nut 225 also contacts a surface on or near the upper surface 245 of the backing plate 140. Rotation of the support nut 225 against the surface of the backing plate 140 raises or lowers the shaft 230, the suspension fitting 220 and gas distribution showerhead 145 relative to the backing plate 140, thus controlling the horizontal profile of the gas distribution showerhead 145. In one embodiment, the first end of the shaft 230 includes a coupling mechanism 240 that facilitates coupling and decoupling of the threaded support member 215 and the suspension fitting 220. A cap 250 is disposed over each of the support nuts 225 to facilitate vacuum sealing around the second openings 205B. In embodiments, where the cover plate 135 is utilized, the cap 250 includes a tubular conduit 255 disposed in the space between the upper surface 245 of the backing plate 140 and the cover plate 135. In one embodiment, the cap 250 includes a clamp portion 260 that is coupled to the cover plate 135 or directly to the backing plate 140 (not shown) by fasteners 265. The clamp portion 260 compresses a seal 270 between the cap 250 and the cover plate 135 or between the cap 250 and the backing plate 140 (not shown).

Figure 3A:
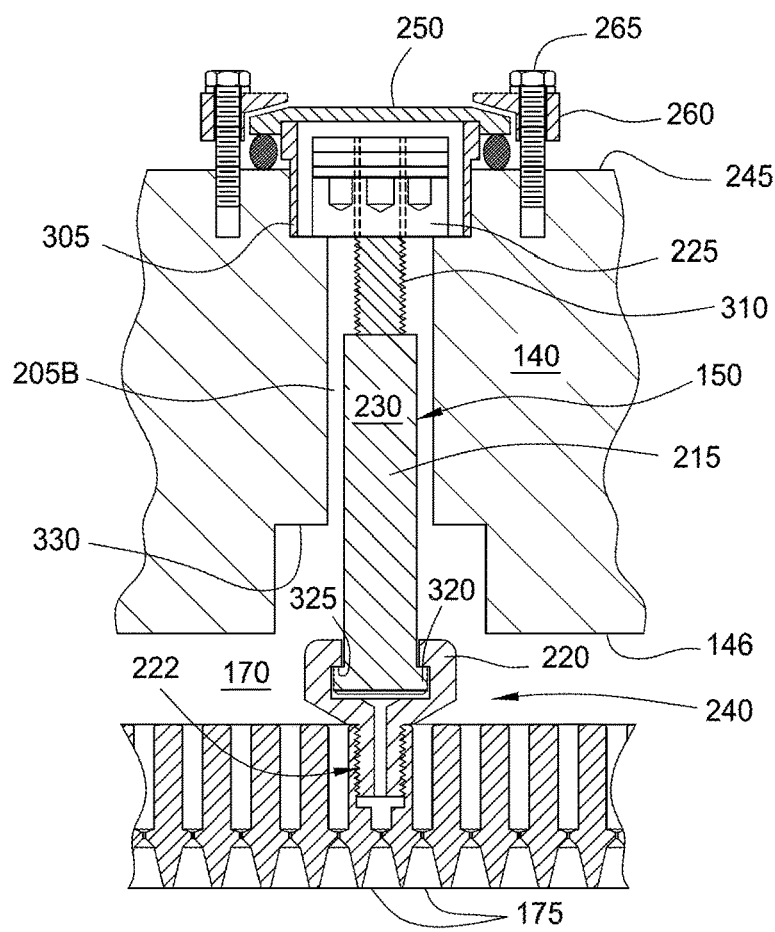
FIG. 3A is a partial cross-sectional view of another embodiment of a backing plate that may be utilized in the chamber of FIG. 1.

FIG. 3A is a partial cross-sectional view of another embodiment of a backing plate 140. In this embodiment, the support nut 225 of the center support member 150 is disposed in a recess 305 formed in the upper surface 245 of the backing plate 140. The support nut 225 may be rotated relative to a threaded portion 310 of the shaft 230 and a surface of the recess 305. A washer made of a friction reducing material (not shown) may be disposed between the surface of the recess 305 and the support nut 225. The washer may also function as a seal to facilitate vacuum sealing of the chamber. Rotation of the support nut 225 facilitates the local force applied to the gas distribution showerhead 145 which, in conjunction with other center support members 150, controls the horizontal profile of the gas distribution showerhead 145. In this embodiment, the cap 250 is shown coupled directly to the backing plate 140 to seal the recess 305.

The coupling mechanism 240 of the center support member 150 is more clearly shown in this view. In one aspect, the coupling mechanism 240 comprises a slot/key device which provides a detachable interface comprising one or more keys 320 disposed on a distal end of the shaft 230 that mate with a respective slot 325 formed in the suspension fitting 220. The coupling mechanism 240 allows the threaded support member 215 to be rotated to couple and decouple with the suspension fitting 220 providing removal of the threaded support member 215 from the backing plate 140. Additionally, the coupling mechanism 240 is configured to allow slight movement between the suspension fitting 220 and the threaded support member 215 when the center support member 150 is installed and tensioned. The gas distribution showerhead 145 is utilized in processing, the gas distribution showerhead 145 experiences temperatures between about ambient (e.g., about 25° C.) to about 350° C. to about 450° C. and, dependent upon the materials of the diffuser, portions of the gas distribution showerhead 145 may undergo expansion and contraction during a process cycle. As the gas distribution showerhead 145 may be subject to lateral movement due to thermal expansion and contraction, the clearance space or "slop" provided by the coupling mechanism 240 allows slight movement between the threaded support member 215 and the suspension fitting 220 to take place. Thus, the movement prevents or minimizes shear forces that may act on the threaded support member 215 and cause the threaded support member 215 to break or bend.

In this embodiment, the second opening 205B includes an expanded portion 330 adjacent the interior surface 146 of the backing plate 140. As the gas distribution showerhead 145 may be subject to lateral movement from expansion and contraction, the expanded portion 330 allows clearance for the center support member 150 to move without interference. Thus, lateral movement of portions of the gas distribution showerhead 145 is permitted in response to any expansion or contraction encountered by the gas distribution showerhead 145 by one or both of the coupling mechanism 240 and the expanded portion 330. In one embodiment, the coupling mechanism 240 and/or the expanded portion 330 permits movement of portions of the gas distribution showerhead 145 between about 0.25 inches to about 0.5 inches. While not shown, a seal, such as an o-ring or bellows, may be installed between an outer surface of the shaft 230 and a surface of the second opening 205B to facilitate vacuum sealing while permitting relative movement of the threaded support member 215 relative to the backing plate 140.

In this embodiment, the coupling mechanism 240 comprises the upper portion of the suspension fitting 220 being configured as a female mating interface while the lower portion of the shaft 230 is adapted as a male mating interface. In another embodiment (not shown), the coupling mechanism 240 may be reversed such that the lower portion of the shaft 230 comprises a female mating interface while the upper portion of the suspension fitting 220 comprises a male mating interface.

Figure 3B:
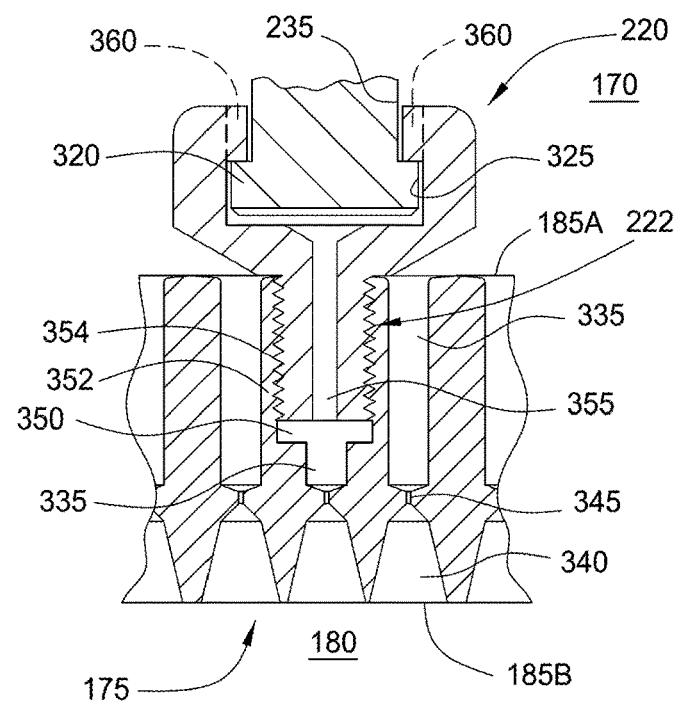
FIG. 3B is a partial enlarged cross-sectional view of one embodiment of a screw device that may be utilized in the backing plate of FIG. 3A.

FIG. 3B is an enlarged cross-sectional view of one embodiment of a suspension fitting 220 disposed in a gas distribution showerhead 145. In one embodiment, the gas distribution showerhead 145 includes a plurality of gas passages 175 having a first bore 335 extending from the upper surface 185A to the lower surface 185B of the gas distribution showerhead 145. The first bore 335 is coupled to at least a second bore 340 fluidly coupled to the first bore 335. The second bore 340 may be flared in the form of a cone or frustum. In some embodiments, the first bore 335 and the second bore 340 are coupled by a restricting orifice 345 having a diameter that is less than a diameter of the first bore 335 and the second bore 340.

The suspension fitting 220 is disposed in an enlarged second bore 350 having a diameter greater than the diameter of the first bore 335 but is less than a pitch or distance between adjacent first bores 335. Thus, a wall 352 is maintained between an adjacent first bore 335 and the enlarged second bore 350 allowing a threaded portion 354 of the suspension fitting 220 to be coupled to mating threads formed in the gas distribution showerhead 145. In one aspect, utilization of the suspension fitting 220 creates two types of gas passages 175 in the gas distribution showerhead 145, for example a first type that is obstructed by the presence of the suspension fitting 220 and a second type that is unobstructed. Thus, the gas passages 175 that do not include a suspension fitting 220 provide unobstructed flow of gas from the intermediate region 170 to the processing region 180 while gas flow through the gas passages 175 having the suspension fitting 220 disposed therein may be at least partially blocked by the presence of the suspension fitting 220. To provide gas to the obstructed gas passage 175 having the suspension fitting 220 disposed therein, the suspension fitting 220 includes a longitudinal bore 355. The longitudinal bore 355 is formed along or substantially parallel to a longitudinal axis of the suspension fitting 220. The longitudinal bore 355 is adapted as an alternate gas passage to allow gases to flow from the intermediate region 170 through the suspension fitting 220 to the second bore 350, and through the restricting orifice 345 to the processing region 180. Gases may flow from the intermediate region 170 around the shaft 230 and through gaps 360 (shown in phantom) formed in the suspension fitting 220 that are in fluid communication with the longitudinal bore 355.

Figure 4B:
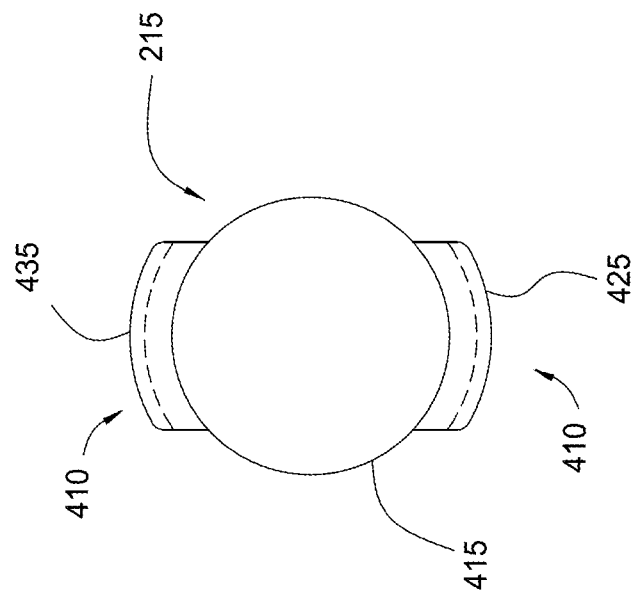
FIG. 4B is a plan view of the threaded support member of FIG. 4A.
Figure 4A:
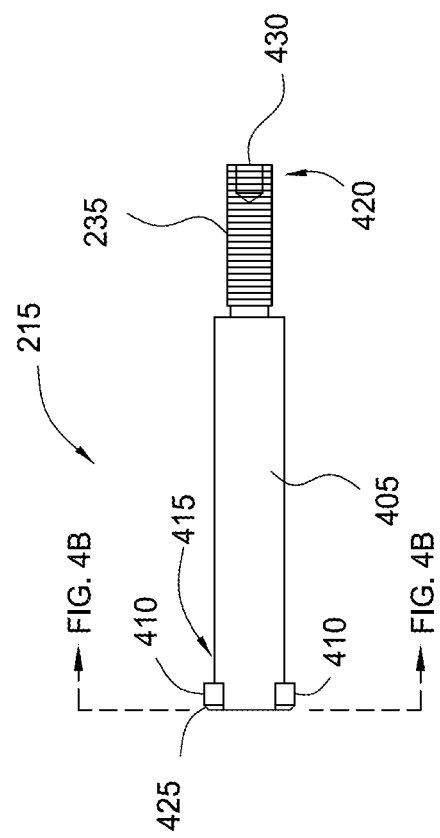
FIG. 4A is a side view of one embodiment of a threaded support member.

FIG. 4A is a side view of one embodiment of a threaded support member 215. The threaded support member 215 includes a support body 405 that in one embodiment includes a circular cross-section. The support body 405 includes one or more key portions 410 extending radially outward from the support body 405 at a first end 415 and a threaded portion 235 on a second end 420 opposite the first end 415. At least a portion of the first end 415 is sized to be inserted into the suspension fitting 220 (FIGS. 2-3B) while the threaded portion 235 is adapted to be received by the support nut 225 (FIGS. 2 and 3A). In one embodiment, the first end 415 includes a taper 425, which may be a bevel or a radius, to facilitate insertion into the suspension fitting 220. The second end 420 may also include a tool interface 430 to facilitate rotational control of the threaded support member 215 utilized in tightening and/or loosening the support nut 225. The tool interface 430 may be a female opening adapted for a hex key, a square key, a TORX® wrench, among other types of screw drive configurations.

FIG. 4B is a plan view of the threaded support member 215 of FIG. 4A. The key portions 410 include an outer dimension, such as an outer diameter 435, which is sized to be inserted and to rotate within an interior channel of the suspension fitting 220.

FIG. 5A is a side cross-sectional view of one embodiment of a suspension fitting 220 having a shaft 230 (shown in phantom) of a threaded support member 215 disposed therein. The suspension fitting 220 includes a support body 505 that is generally circular in shape that tapers to a threaded portion 354. The support body 505 contains a central opening 510 that includes an interior channel 515. The interior channel 515 is at least partially contained by a surface of the central opening 510 and a lip 520 that circumscribes a portion of the diameter of the central opening 510. In one embodiment, the threaded portion 354 comprises a first mating mechanism, for example a male mating mechanism while the central opening 510 and the lip 520 comprises a second mating mechanism, such as a female mating mechanism adapted to receive the first end 415 of the threaded support member 215. The first end 415 of the threaded support member 215 is adapted to rotate in the interior channel 515. In one embodiment, the lip 520 bounding the central opening 510 comprises a slotted receptacle 555 adapted to receive and mate with the key portions 410 of the threaded support member 215.

The support body 505 also includes at least one pin 525 (two are shown in FIG. 5B) that is configured to function as a stop for the key portions 410 of the threaded support member 215 and/or to limit rotation of the threaded support member 215 after installation. The pins 525 may be positioned longitudinally as shown, or the pins may be coupled to support body 505 perpendicular to the longitudinal axis of the suspension fitting 220. The center of the support body 505 includes the central opening 510 that is adapted to receive a portion of the shaft 230. In this embodiment, the shaft 230 of the threaded support member 215 is in a secured position such that key portions 410 are in contact with the lip 520 of the suspension fitting 220 and facilitate support of the gas distribution showerhead 145 from the backing plate 140 (both shown in FIGS. 1-3A). A tool including at least one feature similar to a key portion 410 may also be inserted into the central opening 510 to facilitate rotation and tightening of the suspension fitting 220 and when installing the suspension fitting 220 on the gas distribution showerhead 145.

In one embodiment, the central opening 510 includes a conical recess or tapered surface 530 from the interior channel 515 toward the longitudinal bore 355. The tapered surface 530 is configured to reduce restriction in the suspension fitting 220 and facilitate flow of gases therethrough. In one embodiment, the volume contained below the shaft 230 and the tapered surface 530 comprises a chamber 535 within the suspension fitting 220.

In one embodiment, the support body 505 comprises a head portion 540 at a first end thereof and the threaded portion 354 at a second end thereof. The head portion 540 includes a greater dimension or diameter relative to the diameter of the threaded portion 354. In one embodiment, the head portion 540 includes a first diameter and the threaded portion 354 includes a second diameter that is less than the first diameter. In one aspect, the head portion 540 and the threaded portion 354 are coupled by a frusto-conical surface, such as an exterior taper 545. The head portion 540 includes the central opening 510 and the interior channel 515 while the threaded portion 354 contains the longitudinal bore 355. In one embodiment, the interior channel 515 includes a circular inside diameter 550 that is directly coupled to the longitudinal bore 355 by the tapered surface 530. In one aspect, a flow path having a gradually decreasing diameter is contained within the suspension fitting 220 by one or a combination of the circular inside diameter 550, the tapered surface 530 and the longitudinal bore 355.

FIG. 5B is a top view of the suspension fitting 220 shown in FIG. 5A. The key portions 410 are shown in phantom below the lip 520 such that the threaded support member 215 is in a secured position with the suspension fitting 220. A gap 360 on opposing sides of the shaft 230 is shown exposing a portion of the tapered surface 530 of the suspension fitting 220. The gap 360 allows gases from the intermediate region 170 (FIGS. 1-3A) to flow through the longitudinal bore 355 of the suspension fitting 220 and into the processing region 180 (FIGS. 1-3A).

FIG. 5C is a top view of the suspension fitting 220 shown in FIG. 5B. In this embodiment, the shaft 230 is shown in phantom in a removal position. The shaft 230 is rotated about 45° to allow the key portions 410 to align with an opening between opposing sides of the lip 520. The threaded support member 215 may be removed from the central opening 510 of the suspension fitting 220 as the key portions 410 are aligned as shown in FIG. 5C.

FIG. 6A is side view of one embodiment of a support nut 225 and FIG. 6B is a top view of the support nut 225 shown in FIG. 6A. The support nut 225 includes a body 605 and a through-hole 610 formed between a lower surface 615 and an upper surface 620. The through-hole 610 includes threads 625 formed along the length of the through-hole 610 that is adapted to receive threads formed on the threaded portion 235 of the threaded support member 215. The support nut 225 is adapted to rotate relative to the threaded portion 235 to facilitate support and/or adjustment of the gas distribution showerhead 145 after contact is made between the upper surface 245 of the backing plate 140 and the lower surface 615 of the support nut 225. The rotation of the support nut 225 may be accomplished by hand and/or a wrench or tool adapted to couple to the body 605 of the support nut 225.

In one embodiment, the body 605 is configured as an annular member having an outer diameter 630. In this embodiment, the support nut 225 includes at least two apertures 635 formed in the body 605. The at least two apertures 635 are adapted to provide a coupling point for a tool (not shown), such as a spanner wrench. In another embodiment, the outer surface of the body 605 includes at least two flattened portions, for example six flats 640 (shown in phantom) to facilitate coupling to a tool, such as a hex wrench or socket-type tool.

Figure 7:
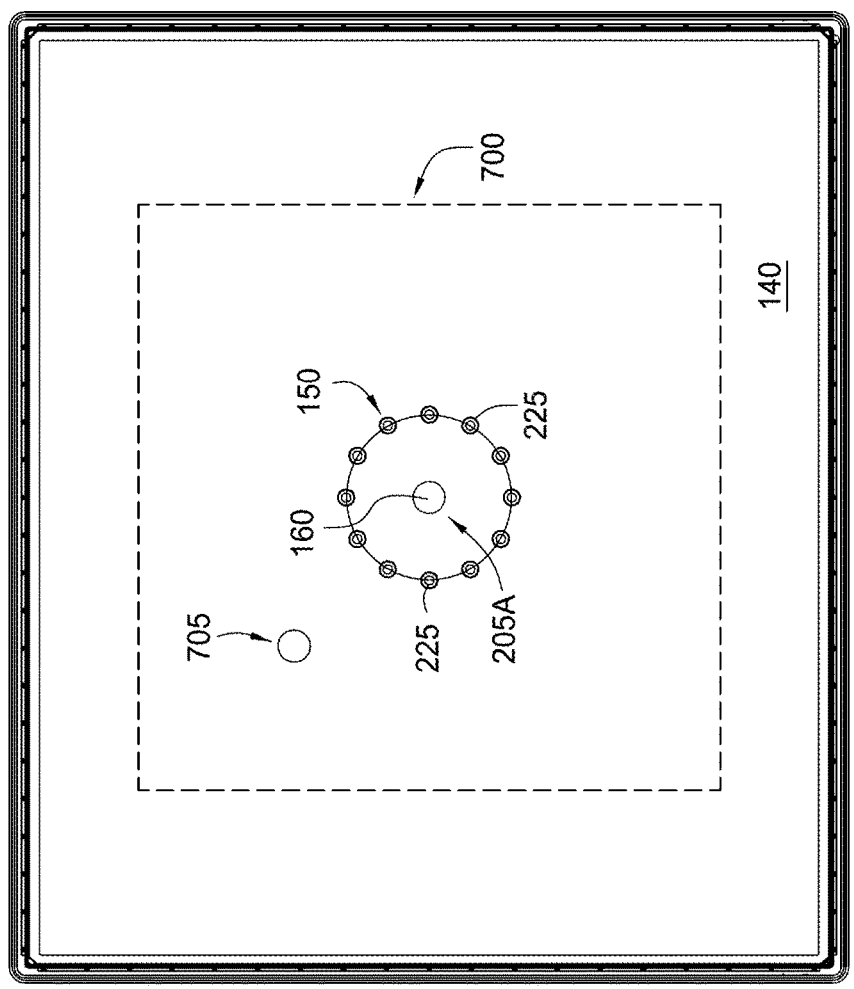
FIG. 7 is a plan view of one embodiment of a backing plate that may be utilized in the chamber of FIG. 1.

FIG. 7 is a plan view of one embodiment of a backing plate 140. In this embodiment, a center area 700 is shown on the backing plate 140 and a pattern of center support members 150 are depicted within the center area 700. The center area 700 may be any centrally located area of the backing plate 140 and gas distribution showerhead 145 that is determined as a support point for the gas distribution showerhead 145. A gas distribution showerhead 145, which is not shown in this view, is typically located below the backing plate 140 and has dimensions substantially equal to the dimensions of backing plate 140. Thus, the gas distribution showerhead 145 has a corresponding center area 700 that may allow any of the elements depicted in the backing plate 140 to mate with the gas distribution showerhead 145.

Although twelve center support members 150 are shown in a symmetrical pattern in this embodiment, the plurality of center support members 150 may be of any pattern, number, and size in the center area 700 of the backing plate 140. Also shown is a first opening 205A in the backing plate 140 that is adapted to receive the gas inlet 160 to supply a gas distribution showerhead 145. An alternative gas passage 705 is also shown and may be used to provide process gases to the gas distribution showerhead 145 alone or in combination with the gas inlet 160. Additional gas passages may also be utilized to deliver gases through the backing plate 140.

Figure 8:
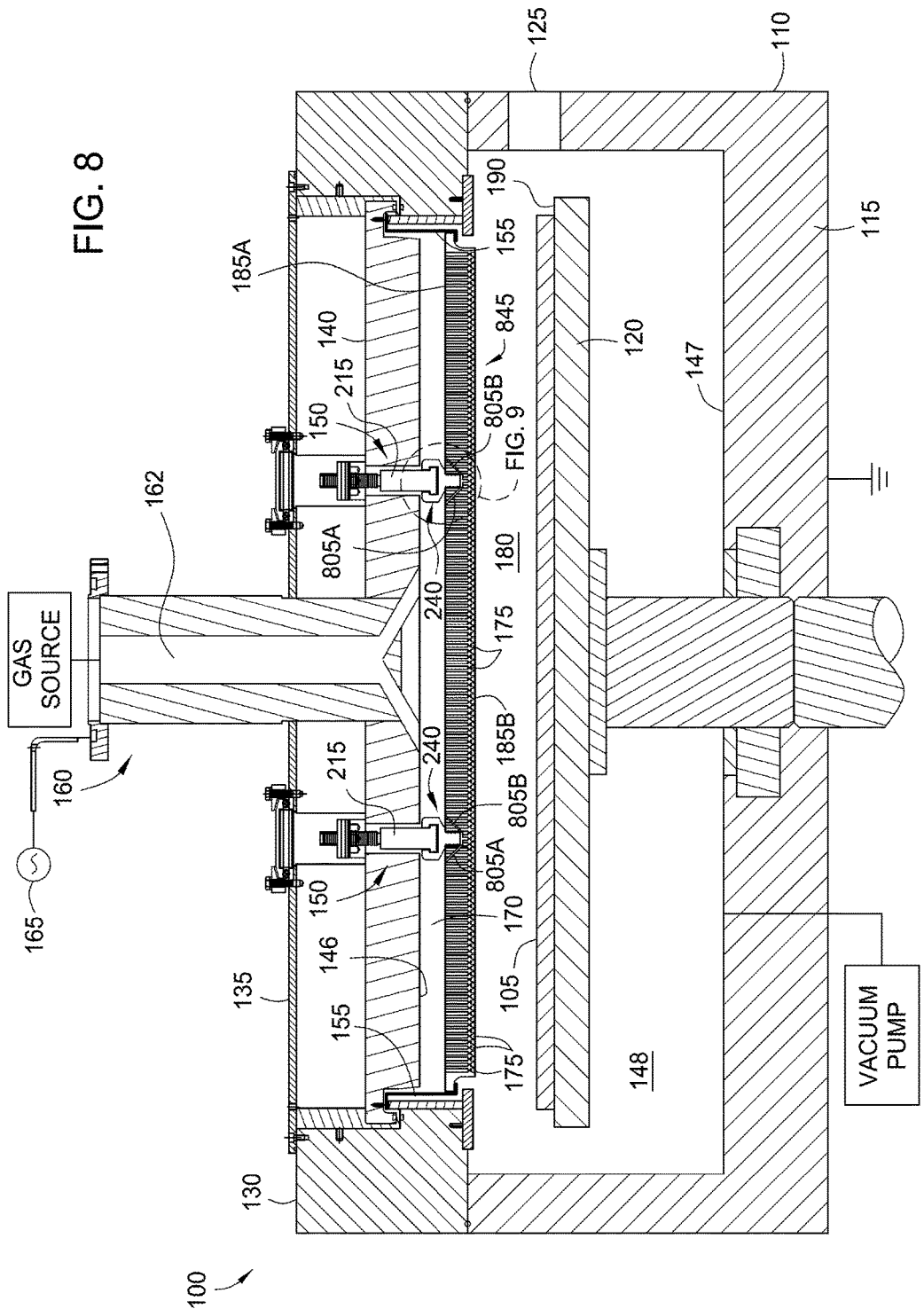
FIG. 8 is a schematic side cross-sectional view of a chamber having another embodiment of a gas distribution showerhead.

FIG. 8 is a schematic side cross-sectional view of a chamber 100 having another embodiment of a gas distribution showerhead 845. The gas distribution showerhead 845 is substantially the same as the gas distribution showerhead 145 shown in FIG. 1 with the exception of inner gas by-pass holes 805A and outer gas by-pass holes 805B formed in the body of the gas distribution showerhead 845. The gas by-pass holes 805A, 805B are adapted as alternative gas passages to provide gas flow to the gas passages 175 that are obstructed by a center support member 150. The gas by-pass holes 805A, 805B are inclined, laterally oriented conduits that are formed in the body of the gas distribution showerhead 845 to provide gas from the intermediate region 170 defined between the backing plate 140 and the gas distribution showerhead 845 to one or more gas passages 175 formed in the gas distribution showerhead 845 adjacent the coupling mechanisms 240. For example, the gas by-pass holes 805A, 805B may be inclined at an acute angle relative to the centerline of the gas passages 175. The gas distribution showerhead 845 may include a plurality of inner gas by-pass holes 805A, a plurality of outer gas by-pass holes 805B, or a combination thereof.

Figure 9:
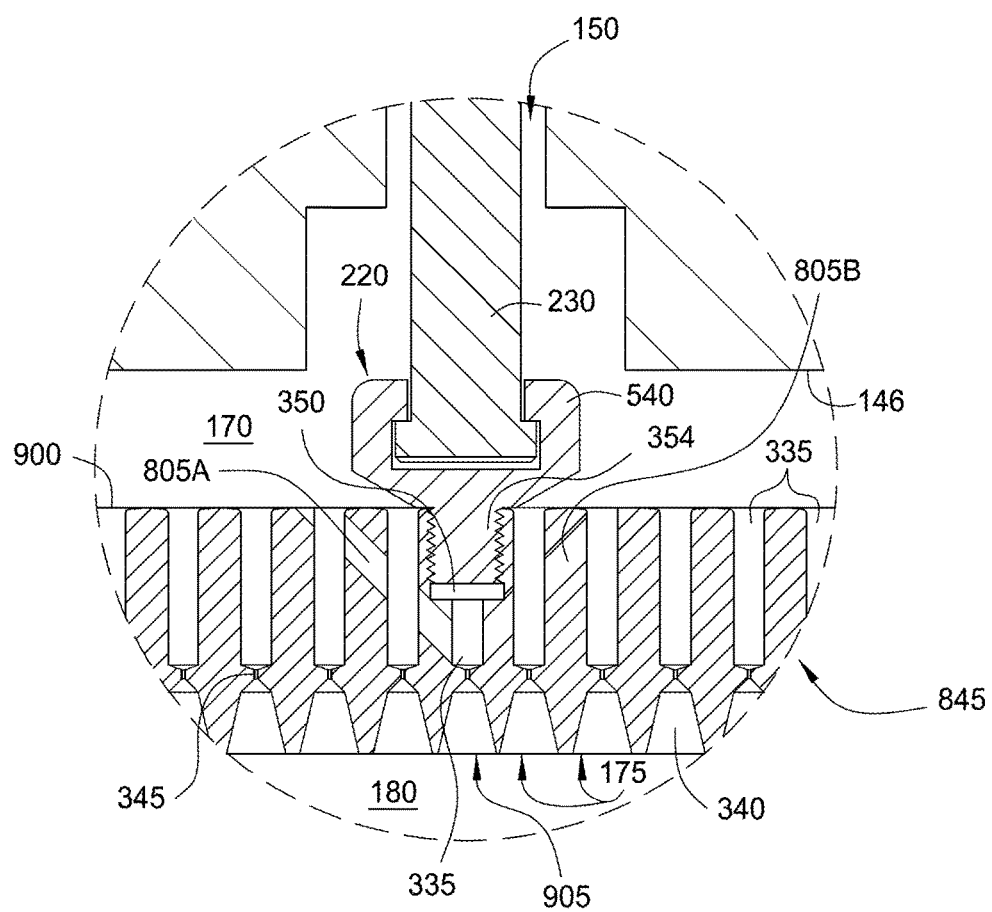
FIG. 9 is an enlarged view of a portion of the gas distribution showerhead of FIG. 8.

FIG. 9 is an enlarged view of a portion of the gas distribution showerhead 845 of FIG. 8. In this embodiment, the suspension fitting 220 disposed in one of the plurality of gas passages 175 does not include a longitudinal bore 355 as shown in FIGS. 3B and 5A, thereby forming an obstructed gas passage 905. One or both of the gas by-pass holes 805A, 805B are utilized to provide gas flow to the processing region 180 at regions below the location of the obstructed gas passage 905. The gas by-pass holes 805A, 805B are utilized to provide a flow of gas through the gas distribution showerhead 845 in areas of the gas distribution showerhead 845 that are at least partially blocked by a center support member 150, specifically the suspension fitting 220. The gas by-pass holes 805A, 805B are disposed at an angle relative to a plane of a surface 900 of the gas distribution showerhead 845. In one embodiment, the angle is about 30 degrees to about 60 degrees, for example, about 40 degrees to about 50 degrees, such as about 45 degrees. The gas by-pass holes 805A, 805B also pass through one or more adjacent first bores 335, which provide enhanced gas flow or conductance to the first bores 335 the gas by-pass holes 805A, 805B are disposed in. The gas by-pass holes 805A, 805B include a diameter that is substantially equal to a diameter of the first bores 335 so that sufficient gas flow is provided to the first bore 335. The gas by-pass holes 805A, 805B also terminate at a position upstream of the restricting orifice 345 in a region between the enlarged second bore 350 of the obstructed gas passage 905. Having the gas by-pass holes 805A, 805B terminate at a position upstream of the restricting orifice 345 allows the gas flow to the obstructed gas passage 905 to be predominantly controlled by the restricting orifice 345, similarly to the control of gas flow by the restricting orifice 345 to gas passages 175 adjacent the obstructed gas passage 905.

Figure 10:
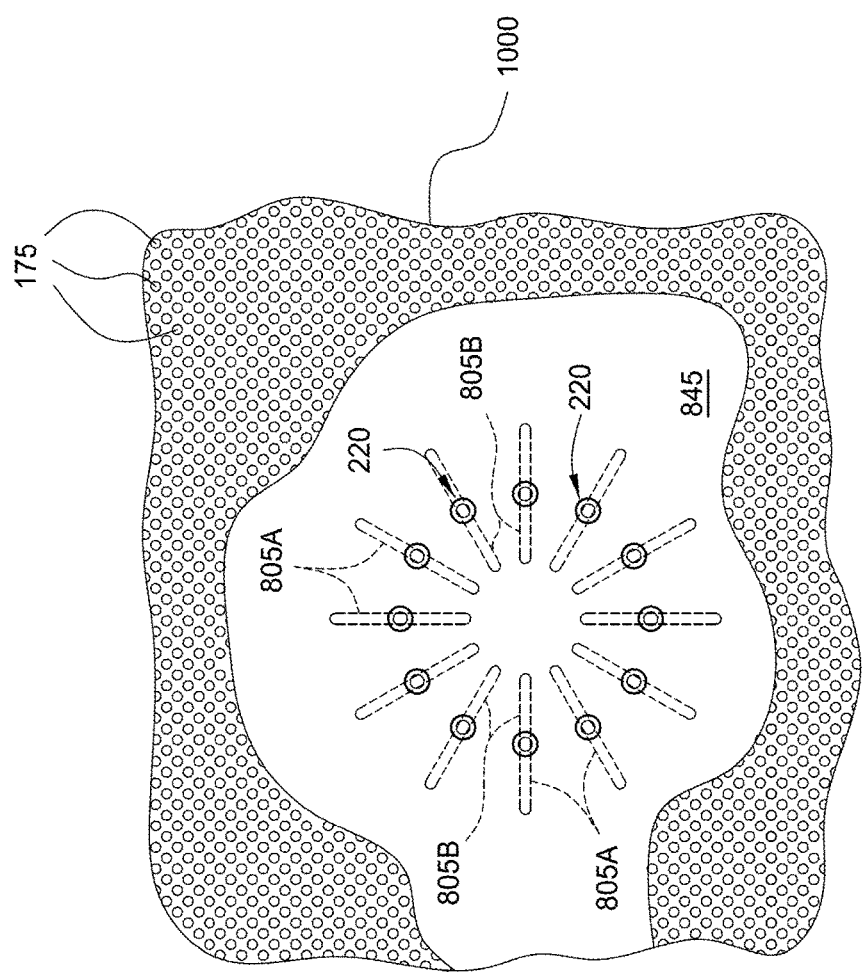
FIG. 10 is a schematic plan view of a portion of one embodiment of a gas distribution showerhead.

FIG. 10 is a schematic bottom view of a portion of one embodiment of a gas distribution showerhead 845. The gas distribution showerhead 845 includes a plurality of inner gas by-pass holes 805A and outer gas by-pass holes 805B that are shown in phantom in a body 1000 of the gas distribution showerhead 845. The enlarged second bore 350 intersecting with the gas by-pass holes 805A, 805B are not shown in FIG. 10. The gas by-pass holes 805A, 805B may be formed in a substantially symmetrical pattern in the gas distribution showerhead 845 to provide symmetrical gas flow to the obstructed gas passage 905 (shown in FIG. 9). The symmetrical pattern is not limited to the pattern shown. The inner gas by-pass holes 805A may be utilized exclusively or in conjunction with the outer gas by-pass holes 805B. Likewise, the outer gas by-pass holes 805B may be utilized exclusively or in conjunction with the inner gas by-pass holes 805A. While an inner gas by-pass hole 805A and an outer gas by-pass hole 805B is shown corresponding to each suspension fitting 220, the number of gas by-pass holes 805A, 805B per suspension fitting 220 may be less than one per suspension fitting 220. In one embodiment, a plurality of inner gas by-pass holes 805A may alternate with each suspension fitting 220. Alternatively or additionally, a plurality of outer gas by-pass holes 805B may alternate with the plurality of inner gas by-pass holes 805A and/or each suspension fitting 220.

FIGS. 11A and 11B are schematic partial cross-sectional views of embodiments of a gas distribution showerhead 1100A and 1100B, respectively. FIG. 11A shows a center area 700 of the backing plate 140 and the gas distribution showerhead 1100A in a concave horizontal profile relative to the backing plate 140. Thus, in this embodiment, the lower surface 185B of the gas distribution showerhead 1100A is non-parallel or dished relative to the horizontal orientation of the backing plate 140. In one embodiment, a first space gap G' is contained between the interior surface 146 of the backing plate 140 and the upper surface 185A in the center area 700 of the gas distribution showerhead 1100A while a second space gap G" is contained between the interior surface 146 of the backing plate 140 and the upper surface 185A in the perimeter of the gas distribution showerhead 1100A.

The first space gap G' may be adjusted by adjusting one or more of the center support members 150 (not shown in FIGS. 8A and 8B). Adjustment off the center support members 150 may be utilized to push the gas distribution showerhead 1100A, 1100B away from the backing plate 140 or pull the gas distribution showerhead 1100A, 1100B toward the backing plate 140 to control the horizontal profiles of the gas distribution showerhead 1100A, 1100B.

The first space gap G' and second space gap G" may be maintained or adjusted to be substantially equal or different. In one example, the first space gap G' and second space gap G" are substantially equal. In another example, the first space gap G' may be less than the second space gap G". In one embodiment, the gas passages 175 have a greater length at the perimeter of the gas distribution showerhead 1100A relative to the gas passages 175 at the center of the gas distribution showerhead 1100A. In one aspect, the flared bores of each of the gas passages 175 include a greater length at a center of the gas distribution showerhead 1100A and the length gradually increases from the center of the gas distribution showerhead 1100A to the perimeter of the gas distribution showerhead 1100A.

FIG. 11B shows a center area 700 of the backing plate 140 and the gas distribution showerhead 1100B in a convex horizontal profile relative to the backing plate 140. While not shown, the first space gap G' and second space gap G" are contained between the interior surface 146 of the backing plate 140 and the upper surface 185A of the gas distribution showerhead 1100B. The first space gap G' and second space gap G" may be maintained or adjusted as described with reference to FIG. 11A. In one embodiment, the first space gap G' and second space gap G" are substantially equal. In another example, the second space gap G" may be less than the first space gap G'. In one embodiment, the gas passages 175 have a greater length at the center of the gas distribution showerhead 1100B relative to the gas passages 175 at the perimeter of the gas distribution showerhead 1100B. In one aspect, the flared bores of each of the gas passages 175 include a greater length at the center of the gas distribution showerhead 1100B and the length gradually decreases from the center of the gas distribution showerhead 1100B to the perimeter of the gas distribution showerhead 1100B.

A method of installing the center support members 150 will be described in reference to FIGS. 3A-5B. A suspension fitting 220 is inserted into the female threads in the gas distribution showerhead 145. The threaded support member 215 is inserted into a second opening 205B in the backing plate 140 and the key portions 410 are engaged in a central opening 510 formed in the suspension fitting 220. The threaded support member 215 is rotated about 45° to a locked position in the suspension fitting 220 that is determined by the key portions 410 contacting a pin(s) 525 in the suspension fitting 220. The support nut 225 may be engaged onto the threaded portion 235 and rotated until contact is made with a surface adjacent the upper surface 245 of the backing plate 140.

The relative position of the support nut 225, positioned against a surface adjacent the upper surface 245 of the backing plate 140, may be utilized to control the horizontal profile of the gas distribution showerhead 145. In one embodiment, contact between the support nut 225 of the center support member 150 and the upper surface 245 of the backing plate 140 may be utilized to maintain a space gap between the interior surface 146 of the backing plate 140 and the upper surface 185A of the gas distribution showerhead 145. If the user desires or the intended process warrants raising the center area of the gas distribution showerhead 145, the support nut 225 may be further rotated to raise the center area and/or change the horizontal profile of the gas distribution showerhead 145 relative to the backing plate 140. Thus, the space gap between the interior surface 146 of the backing plate 140 and the upper surface 185A of the gas distribution showerhead 145 may be adjusted if needed. Additionally, the adjusted space gap may be maintained during processing by contact between the support nut 225 of the center support member 150 and the upper surface 245 of the backing plate 140.

The above method of adjusting the profile of the gas distribution showerhead 145 may be performed, monitored, and adjusted under vacuum conditions or at ambient pressure conditions. When all adjustments are made and the gas distribution showerhead 145 exhibits a desired horizontal profile, or at a predetermined horizontal profile to anticipate known deformations, the cap 250 may be installed.

EXAMPLES

Tests were conducted to determine film thickness of silicon dioxide ($SiO_2$) on a substrate. Control tests were performed using a chamber similar to the chamber 100 described herein. The control tests utilized a gas distribution showerhead having support members coupled between a backing plate and the gas distribution showerhead where gas passages 175 of the gas distribution showerhead were sacrificed for a center support member. The control tests included two-dimensional mapping of the deposition on the substrate at positions on the substrate below the locations of gas passages 175 that are sacrificed for use as a supporting point. Average film thickness on areas of the substrate below the gas passages 175 sacrificed for supporting points were about 2.8% less than the average film thickness on areas of the substrate that were not below the center support members. Thus, the pattern of support members was recognizable on the substrate.

Other tests utilizing a gas distribution showerhead 145 having center support members 150 utilizing the suspension fitting 220 having the longitudinal bore 355 as described herein were also performed. The tests included two-dimensional mapping of $SiO_2$ film thickness on a substrate at positions below the locations of the center support members 150. Areas of the substrate below the center support members 150 showed an average $SiO_2$ film thickness that was substantially equal to the film thickness on areas of the substrate that were not below the center support members 150. Thus, the center support members 150 utilizing the suspension fitting 220 having the longitudinal bore 355 as described herein improved film thickness uniformity across the surface of the substrate.

Further tests showed that using screw devices 220 having first bores with a 0.10" diameter, a 0.12" diameter and a 0.14" diameter yielded increased film thickness but the film thickness varied where patterns were detected on the substrate. Testing of a suspension fitting 220 having a longitudinal bore 355 with a diameter of about 0.14" showed no recognizable pattern of on the substrate.

An apparatus and method for supporting a gas distribution showerhead that maintains the processing space between the substrate and the gas distribution showerhead and does not interfere with gas flow through the gas distribution showerhead is described. The apparatus includes one or more center support members 150 that maintain and/or provide manipulation the cross-sectional curvature or horizontal profile of the gas distribution showerhead 145. The gas distribution showerhead 145 may be manipulated to present a horizontal profile that is one of planar, convex, or concave. The horizontal profile of the gas distribution showerhead 145 may be adjusted relative a substrate support 120 and/or a backing plate 140 in a chamber. The embodiments of the center support members 150 as described herein also does not interfere with gas flow thereby facilitating deposition at locations of the substrate adjacent the center support members 150.

While the foregoing is directed to embodiments of the present invention, other and further embodiments of the invention may be devised without departing from the basic scope thereof, and the scope thereof is determined by the claims that follow.

The invention claimed is:

1. A gas distribution showerhead for a vacuum chamber, the gas distribution showerhead comprising:
a body having a first side and a second side opposite the first side, and a plurality of openings formed through the body in a longitudinal direction, each of the plurality of openings comprising a first bore formed in the first side that is fluidly coupled to a second bore formed in the second side by an orifice hole;
a first gas passage formed through the body, the first gas passage extending from the first side toward the second side in an oblique angle relative to the longitudinal direction of the plurality of openings and intersecting with one of the first bores of the plurality of openings such that the first gas passage provides a flow path to the one of the first bores; and
a second gas passage formed through the body, the second gas passage extending from the first side in an oblique angle relative to the longitudinal direction of the plurality of openings and intersecting with the one of the first bores of the plurality of openings such that the second gas passage provides a flow path to the one of the first bores.

2. The gas distribution showerhead of claim 1, wherein a portion of the one of the first bores comprises a suspension feature for the gas distribution showerhead.

3. The gas distribution showerhead of claim 2, wherein the suspension feature comprises a female mating interface.

4. The gas distribution showerhead of claim 1, wherein the first gas passage or the second gas passage comprises a laterally oriented hole formed in the body of the gas distribution showerhead.

5. The gas distribution showerhead of claim 4, wherein the laterally oriented hole is formed at an oblique angle relative to a horizontal plane defined by a surface of the gas distribution showerhead.

6. The gas distribution showerhead of claim 4, wherein the laterally oriented hole extends at least partially through one or more adjacent first bores of the plurality of openings.

7. The gas distribution showerhead of claim 4, wherein the angle is about 30 degrees to about 60 degrees.

8. The gas distribution showerhead of claim 4, wherein a diameter of the laterally oriented hole is substantially equal to a diameter of the first bores of the plurality of openings.

9. The gas distribution showerhead of claim 1, wherein the first gas passage and the second gas passage are positioned symmetrically about the one of the first bores.

10. A gas distribution showerhead for a vacuum chamber, the gas distribution showerhead comprising:
a body having a first side and a second side opposite the first side, the body having a plurality of first openings formed in a longitudinal direction between the first side and the second side, each of the plurality of first openings having a first bore formed in the first side that is fluidly coupled to a second bore formed in the second side by a restricting orifice; and
a plurality of second openings surrounding one of the plurality of first openings, each of the plurality of second openings being formed through the body from the first side at an oblique angle relative to the longitudinal direction of the one of the plurality of first openings and terminating within the body to intersect with the one of the plurality of first openings.

11. The gas distribution showerhead of claim 10, wherein each of the plurality of second openings comprise a laterally oriented bore.

12. The gas distribution showerhead of claim 11, wherein the laterally oriented bore is formed at an oblique angle relative to a horizontal plane defined by a surface of the gas distribution showerhead.

13. The gas distribution showerhead of claim 12, wherein the laterally oriented bore terminates at a position upstream of the restricting orifice.

14. The gas distribution showerhead of claim 12, wherein a diameter of the laterally oriented bore is substantially equal to a diameter of the one of the plurality of first openings.

15. The gas distribution showerhead of claim 11, wherein the laterally oriented bore extends at least partially through one or more adjacent first openings.

16. A gas distribution showerhead for a vacuum chamber, the gas distribution showerhead comprising:
a body having a first side and a second side opposite the first side, the body having a plurality of first openings formed between the first side and the second side, each of the plurality of first openings having a first bore formed in the first side that is fluidly coupled to a second bore formed in the second side by a restricting orifice along a longitudinal direction; and
a plurality of second openings surrounding one of the plurality of first openings, each of the plurality of second openings being formed through the body from the first side at an oblique angle relative to the longitudinal direction of the one of the plurality of first openings and terminating within the body to intersect with the one of the plurality of first openings, wherein at least one of the plurality of second openings opposes another one of the plurality of second openings.

17. The gas distribution showerhead of claim 16, wherein each of the plurality of second openings comprise a laterally oriented hole formed at an oblique angle relative to a horizontal plane defined by a surface of the gas distribution showerhead.

18. The gas distribution showerhead of claim 16, wherein each of the plurality of second openings comprise a laterally oriented hole that extends at least partially through one or more adjacent first openings.

19. The gas distribution showerhead of claim 16, wherein each of the plurality of second openings comprise a laterally oriented hole that terminates at a position upstream of the restricting orifice.

20. The gas distribution showerhead of claim 16, wherein each of the plurality of second openings comprise a laterally oriented hole having a diameter that is substantially equal to a diameter of other first openings of the plurality of first openings.

* * * * *